(12) United States Patent
Huang et al.

(10) Patent No.: US 7,033,883 B2
(45) Date of Patent: Apr. 25, 2006

(54) PLACEMENT METHOD FOR DECOUPLING CAPACITORS

(75) Inventors: Chien-Chia Huang, ZhuBei (TW); Yu-Wen Tsai, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 90 days.

(21) Appl. No.: 10/861,636

(22) Filed: Jun. 4, 2004

(65) Prior Publication Data

US 2005/0269599 A1 Dec. 8, 2005

(51) Int. Cl.
*H01L 21/8234* (2006.01)
*H01L 21/8244* (2006.01)
(52) U.S. Cl. .................... 438/238; 438/239; 438/386; 438/399
(58) Field of Classification Search ................ 438/238, 438/239, 386, 399; 257/296
See application file for complete search history.

(56) References Cited

U.S. PATENT DOCUMENTS 6,337,593 B1 * 1/2002 Mizuno et al. ............. 327/534
6,748,579 B1 * 6/2004 Dillon et al. ................. 716/19

* cited by examiner

*Primary Examiner*—Thien F. Tran
(74) *Attorney, Agent, or Firm*—Thomas, Kayden, Horstemeyer & Risley

(57) ABSTRACT

A method for placing decoupling capacitors in an integrated circuit during placement and routing stage. In the placement method, a floor plan of the integrated circuit is created, and includes the relative locations of a plurality of functional units. A power mesh comprising a plurality power lines is then overlaid on the floor plan, and the floor plan is divided into a plurality of windows. A plurality of semiconductor cells are placed into a portion of the windows. It is then determined whether a residual area comprising two adjacent windows without functional units and semiconductor cells disposed therein and at least three parallel power lines running theretrough exists. A MOS capacitor is then placed in the detected residual area, serving as a decoupling capacitor.

12 Claims, 6 Drawing Sheets

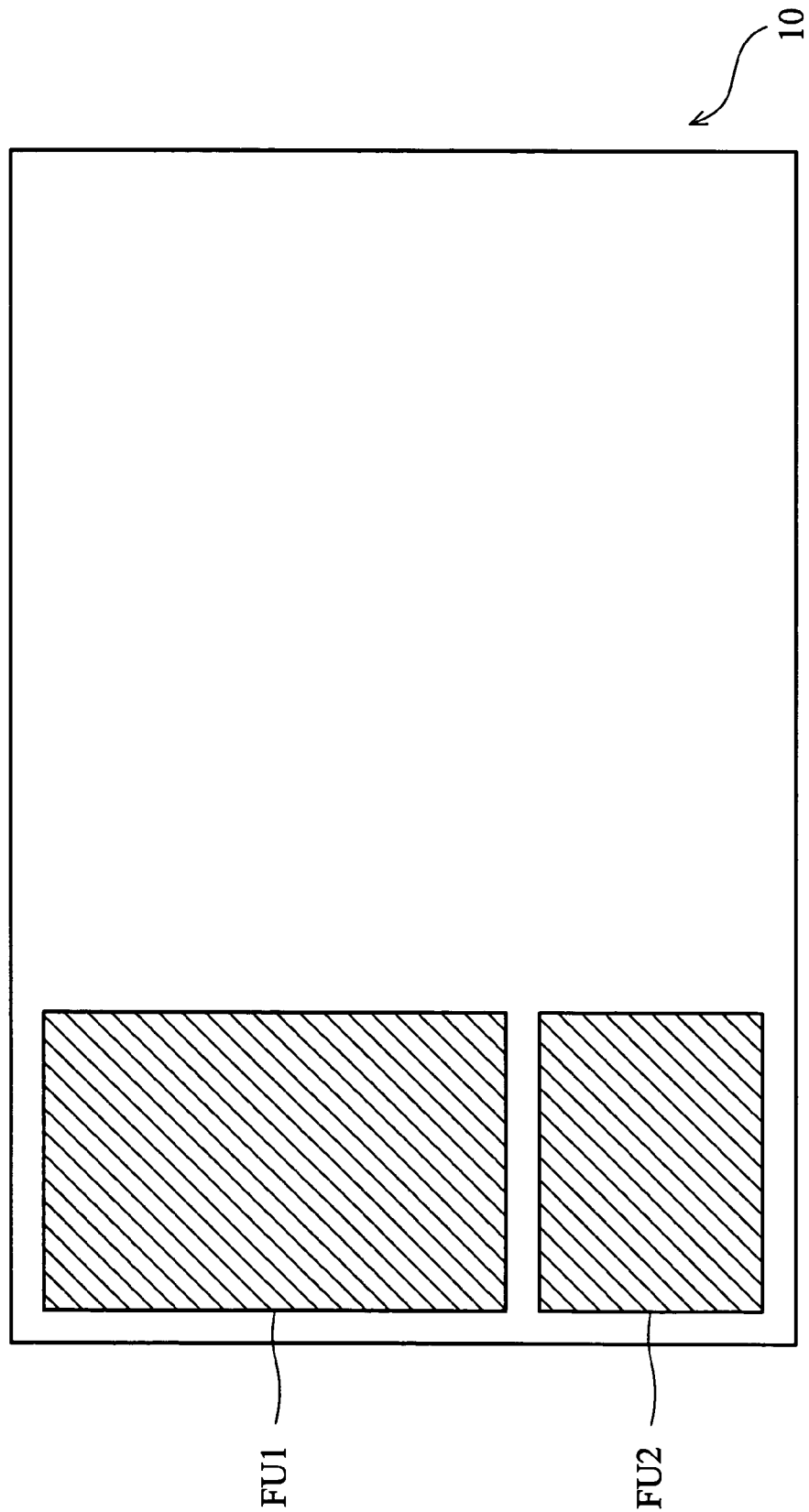

PLACEMENT METHOD FOR DECOUPLING CAPACITORS

BACKGROUND OF THE INVENTION

1. Field of the Invention

The present invention relates to a placement method, and more particularly, to a placement method for decoupling capacitors in a semiconductor circuit and a semiconductor structure using the same.

2. Description of the Related Art

A current trend in semiconductor design, particularly for application specific integrated circuits (ASICs) and advanced/complex semiconductor integrated circuit devices, such as microprocessors, is to lower operating power, thus trend driving power supply and device threshold voltages to lower levels. Another trend emphasizing the need for decoupling is that voltage scaling has lagged behind area/capacitance scaling. As the supply voltage (VCC) and device threshold voltage (Vt) drop, the ratio of noise voltage to Vt and VCC increase, since noise levels do not scale down at the same rate as Vt and VCC. Consequently, sensitivity to noise in these types of semiconductor integrated circuit devices increase. In order to minimize noise effects, decoupling capacitors are often needed in VLSI circuits.

Capacitance per unit area provided by conventional capacitance cells, however, is low due to capacitance cell layout style and layout rule.

SUMMARY OF THE INVENTION

Therefore an object of the present invention is to place decoupling capacitors in an integrated circuit to minimize noise effects.

According to the above mentioned object, the present invention provides a method for placing decoupling capacitors to in integrated circuit during the placement and routing stage of fabrication process.

In the placement method, a floor plan of the integrated circuit is created during the placement and routing stage. The floor plan comprises the relative locations of a plurality of functional units. A power mesh is then overlaid on the floor plan. The power mesh comprises a plurality of power lines and divides the floor plan into a plurality of windows. A plurality of semiconductor cells are placed into a portion of the windows. First it is determined whether a residual area comprising two adjacent windows without functional units and semiconductor cells disposed therein and at least three parallel power lines running theretrough exists. A MOS capacitor is then placed in the detected residual area, serving as a decoupling capacitor. The MOS capacitor has a gate connected to the middle of the three power lines in the detected residual area, and a drain and a source are respectively connected to the remaining two power lines.

According to the above objects, the present invention also provides a semiconductor structure. In the semiconductor structure, a plurality of functional units are disposed in a substrate, and a power mesh is disposed on the substrate. The power mesh comprises a plurality of first power lines and a plurality of second power lines, wherein the first and second power lines are arranged alternately. A MOS capacitor is disposed in the substrate, and has a gate connected to one of the first power lines, and a drain and a source respectively connected to the second power line adjacent to the first power line connected to the gate.

BRIEF DESCRIPTION OF THE DRAWINGS

The present invention can be more fully understood by the subsequent detailed description and examples with reference made to the accompanying drawings, wherein:

FIG. 2A shows a floor plan of an integrated circuit;

DETAILED DESCRIPTION OF THE INVENTION

Figure 1:
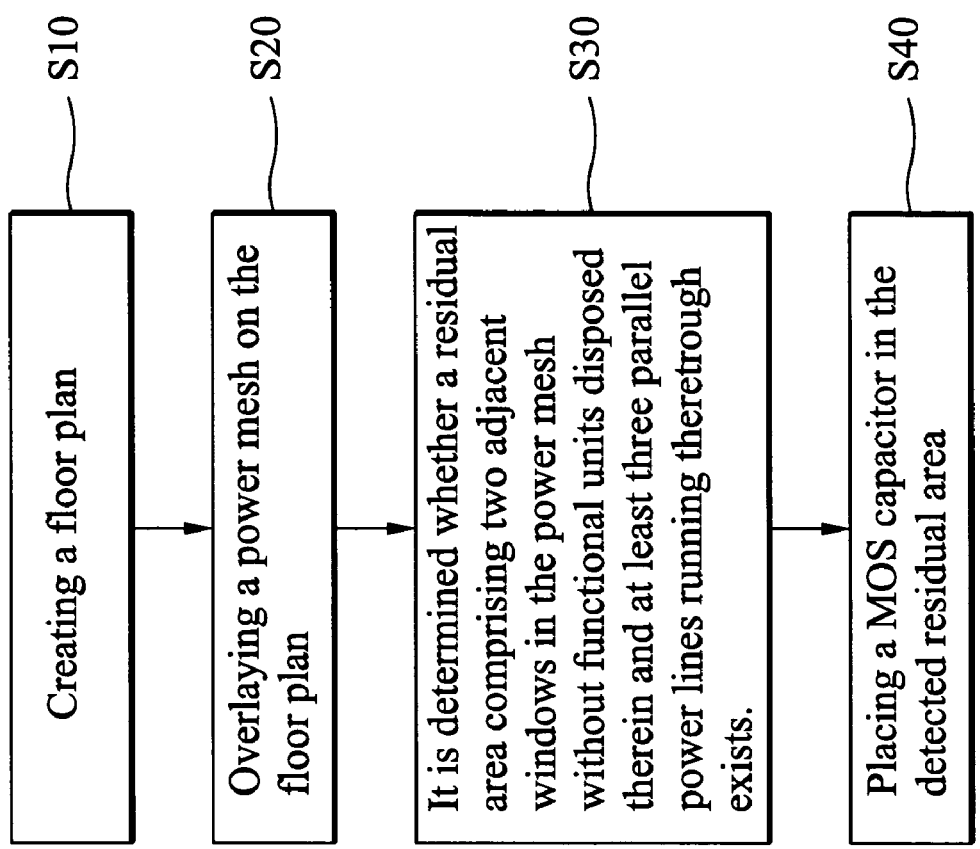
FIG. 1 is a flowchart of the placement method for decoupling capacitors in an integrated circuit according to the present invention.

FIG. 1 is a flowchart of the placement method for decoupling capacitors in an integrated circuit according to the present invention. In step S10, a floor plan 10 of the integrated circuit is created during the placement and routing stage, as shown in FIG. 2A. The floor plan 10 shows the relative locations of a plurality of functional units FU1 and FU2. In this case, the functional units can be memory cells, microprocessors or the others.

Figure 2B:
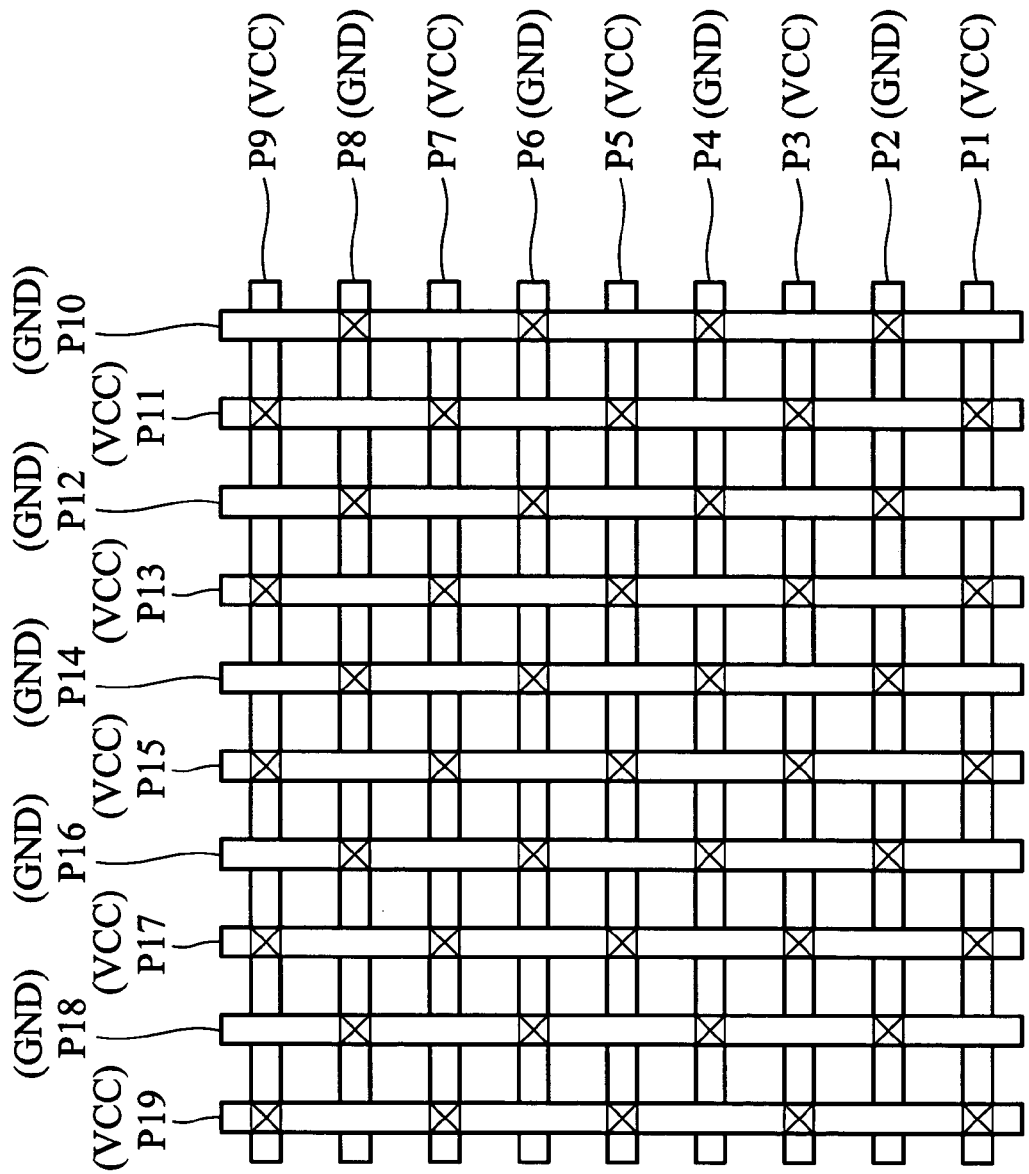
FIG. 2B shows a power mesh structure according to the present invention.

FIG. 2B shows a power mesh structure 15. The power mesh 15 comprises a plurality of power lines P1~P19. For example, the power lines P1~P9 are typically assigned to first metal layer (M1), and the power lines P10~P19 are usually assigned to second metal layer (M2). The power lines P1, P3, P5, P7, P9, P11, P13, P15, P17 and P19 can be coupled to supply voltage VCC, and power lines P2, P4, P6, P8, P10, P12, P14, P16 and P18 can be coupled to ground GND, and vice versa. Power lines P1, P3, P5, P7 and P9 of the first metal layer (M1) and power lines P11, P13, P15, P17 and P19 of the second metal layer (M2) are connected to each other through contacts (not shown). Power lines P2, P4, P6 and P8 of the first metal layer (M1) and power lines P10, P12, P14, P16 and P18 of the second metal layer (M2) are connected to each other through contacts (not shown). The power lines of supply voltage VCC and GND are arranged alternately.

Figure 2C:
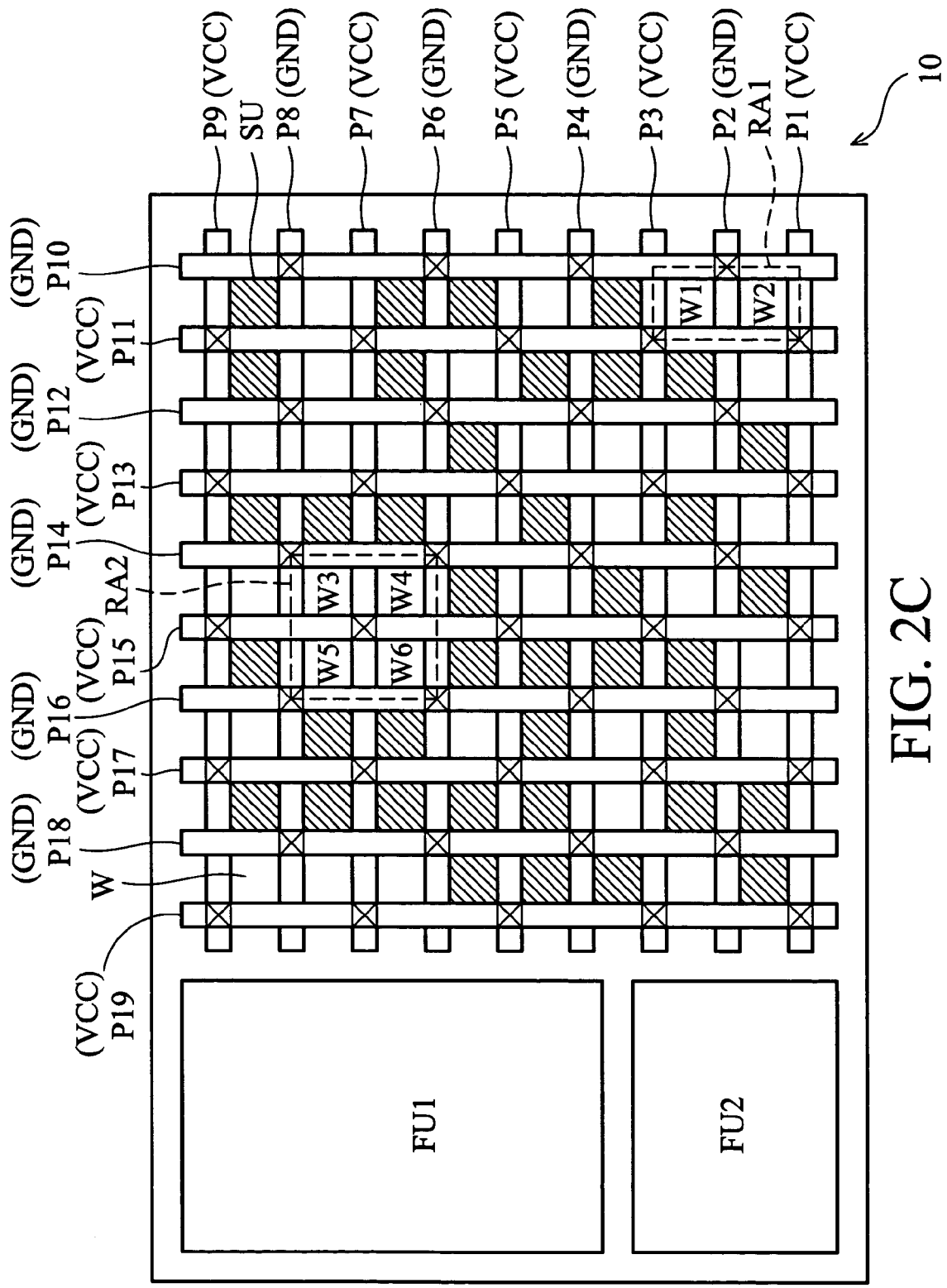
FIG. 2C shows the floor plan with the power mesh structure shown in FIG. 2B.

Next, in step S20, the power mesh 15 is overlaid on the floor plan 10, dividing the floor plan into a plurality of windows W, as shown in FIG. 2C. Then, a plurality of semiconductor cells SU are placed into the windows W. The semiconductor cells SU can be logic gates, active devices, passive devices or a combination thereof. For example, the active devices comprise switching devices, transistors and the like, and the passive devices comprise resistors, capacitors, inductors and the like, and the logic gates comprises OR gate, NOR gate, AND gate, NAND gate or a combination thereof.

In step S30, it is determined whether a residual area comprising two adjacent windows in the power mesh without functional units disposed therein and at least three parallel power lines running theretrough exists. As shown in FIG. 2C, for example, the residual area RA1 comprises two adjacent windows W1 and W2 and three parallel power lines P2~P4, with no functional units and semiconductor cells arranged therein. The residual area Ra2 comprises four adjacent windows W3~W4 and three parallel power lines P6~P8, with no functional units semiconductor cells SU arranged therein. Consequently, the residual areas RA1 and RA2 can be detected.

Figure 2D:
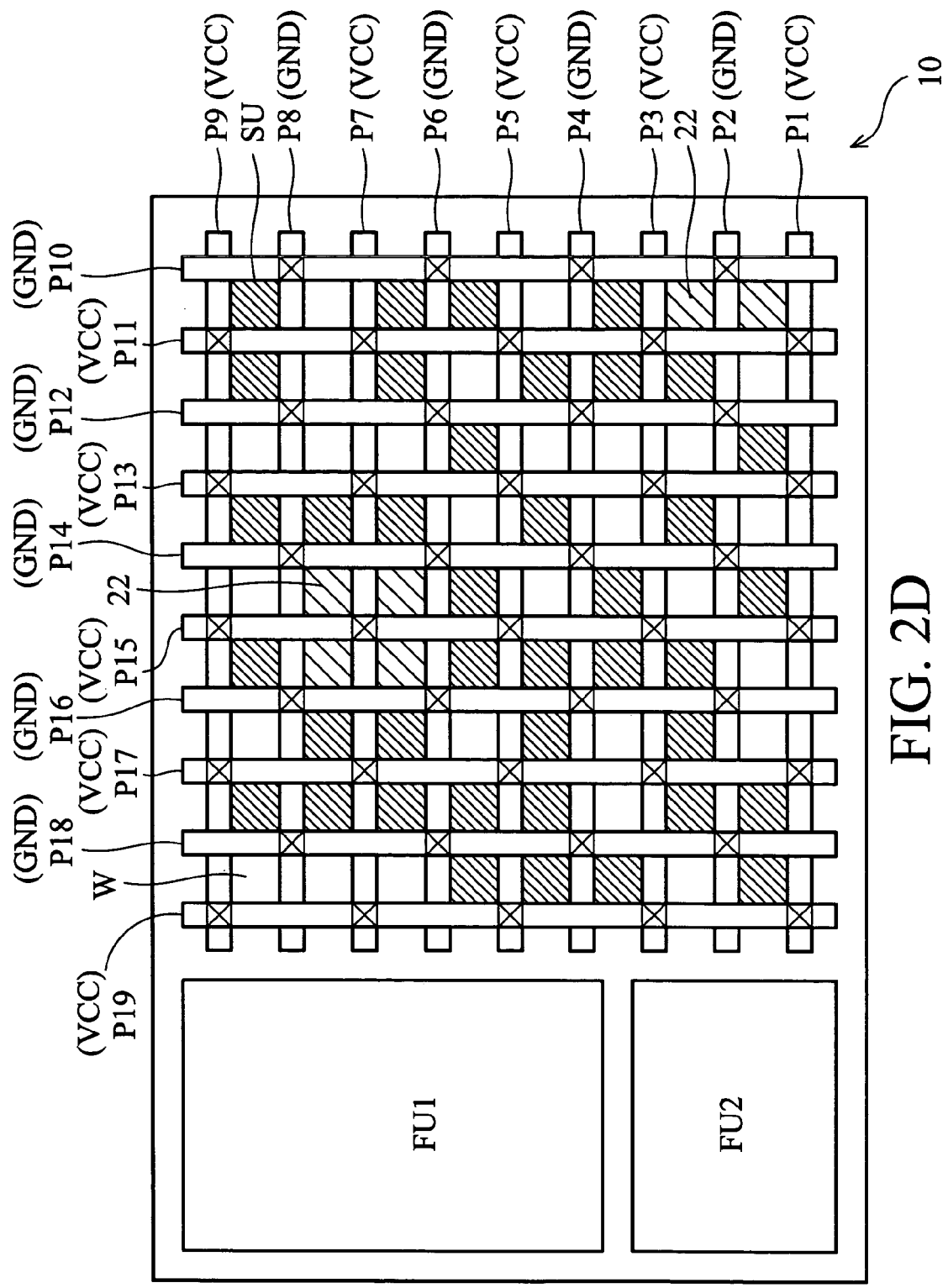
FIG. 2D shows a semiconductor structure according to the present invention.
Figure 3:
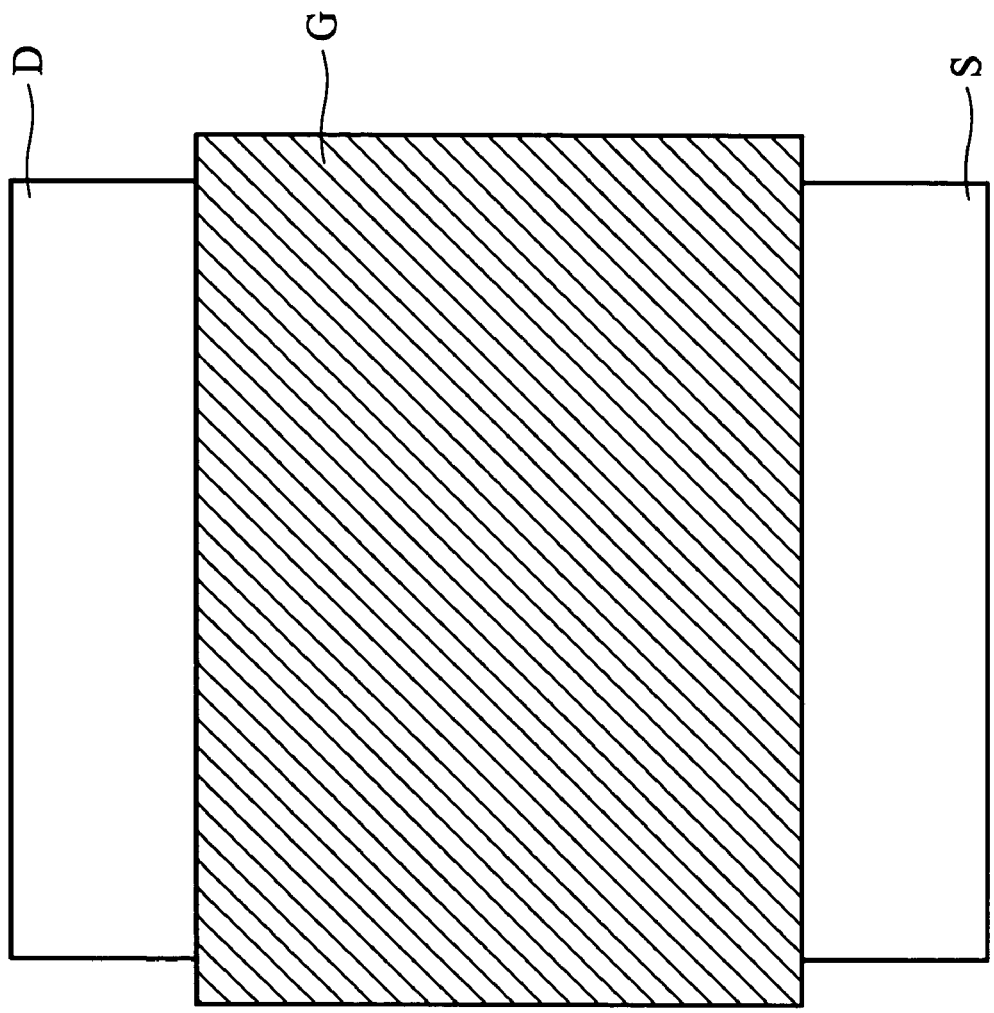
FIG. 3 shows a structure diagram of MOS capacitor according to the present invention.

Next, the MOS capacitors 30 shown in FIG. 3 can be placed in the detected residual areas (RA1 or RA2), to serve as decoupling capacitors, as shown in FIG. 2D. FIG. 3 shows the structure of the MOS capacitor 30. For example, when the MOS capacitor 30 is placed in the residual area RA1, the drain D of the MOS capacitor 30 is connected to the power line P2 by contacts, the gate G of the MOS capacitor 30 is connected to the power line P3 by contacts, and the source of the MOS capacitor 30 is connected to the power line P4 by contacts. In addition, when the MOS capacitor 30 is placed in the residual area RA2, the drain D of the MOS capacitor 30 is connected to the power line P6 by contacts, the gate G of the MOS capacitor 30 is connected to the power line P7 by contacts, and the source of the MOS capacitor 30 is connected to the power line P8 by contacts.

As shown in FIG. 2B, the power lines P1, P3, P5, P7, P9, P11, P13, P15, P17 and P19 are coupled to supply voltage VCC, and power lines P2, P4, P6, P8, P10, P12, P14, P16 and P18 are coupled to ground GND. In this case, the MOS capacitor 22 and 24 can be PMOS transistors with a gate coupled to the ground GND and a source and drain both coupled to the supply voltage VCC. When the power lines P1, P3, P5, P7, P9, P11, P13, P15, P17 and P19 are coupled to ground GND, and power lines P2, P4, P6, P8, P10, P12, P14, P16 and P18 are coupled to supply voltage VCC, the MOS capacitors 22 and 24 can be NMOS transistors with a gate coupled to the supply voltage VCC and a source and drain both coupled to the ground GND.

Therefore, in the placement method of the present invention, at least one decoupling capacitor can be placed in an integrated circuit during the placement and routing stage in IC design, thereby minimizing noise effects.

If a single PMOS capacitor, NMOS or a combination of PMOS and NMOS transistors is placed in one window of the power mesh, extra metal routing lines and contacts connected to the MOS capacitors and power lines are required, and spacing between P/N MOS transistors must be considered. The present invention can place MOS capacitors in a power mesh layout style integrated circuit to serve as decoupling capacitors without regard to spacing of the P/N MOS transistors in one window of the power mesh.

The present invention also provides a semiconductor structure as shown in FIG. 2D. As shown in the floor plan 10, a plurality of functional units FU1 and FU2 are disposed in a substrate (not shown), the functional units can be memory cells, microprocessor or the others. The floor plan 10 shows the relative locations of a plurality of functional units FU1 and FU2.

The power mesh 15 is disposed on the substrate, and comprises a plurality of first power lines and a plurality of second power lines, and the first and second power lines are arranged alternately. In this case, the power mesh 15 comprises a plurality of power lines P1~P19. For example, the power line P1~P9 are usually assigned to the first metal layer (M1), and the power lines P10~P19 are usually assigned to the second metal layer (M2). The power lines P1, P3, P5, P7, P9, P11, P13, P15, P17 and P19 can be coupled to supply voltage VCC, and power lines P2, P4, P6, P8, P10, P12, P14, P16 and P18 can be coupled to ground GND, and vice versa. Power lines P1, P3, P5, P7 and P9 of the first metal layer (M1) and power lines P11, P13, P15, P17 and P19 of the second metal layer (M2) are connected to each other through contacts (not shown). Power lines P2, P4, P6 and P8 of the first metal layer (M1) and power lines P10, P12, P14, P16 and P18 of the second metal layer (M2) are connected to each other through contacts (not shown). The power lines of supply voltage VCC and GND are arranged alternately.

A plurality of semiconductor cells SU can be placed into a portion of the windows W. The semiconductor cells SU comprises active devices, passive devices or a combination thereof. Semiconductor cells SU can be OR gates, NOR gates, AND gates, NAND gates or a combination thereof. For example, the active devices comprise switching devices, transistors and the like, and the passive devices comprise resistors, capacitors, inductors and the like.

A MOS capacitor 22 is disposed in the substrate, and has a gate connected to power line P3, and a drain and a source respectively connected to the second power lines P2 and P4 adjacent to the power line P1 connected to the gate.

When the MOS capacitor 30 shown in FIG. 3 serving as the MOS capacitor is placed in the residual area RA1, the metal lines ML1~ML3 correspond to the power lines P2~P4. Namely, the MOS capacitor 30 has a gate G connected to the power line P3 (metal line ML2), and a drain D and source S connected to the power lines P2 and P4 (the metal lines ML1 and ML3) respectively. As shown in FIG. 2B, the power lines P1, P3, P5, P7, P9, P11, P13, P15, P17 and P19 are coupled to the supply voltage VCC, and power lines P2, P4, P6, P8, P10, P12, P14, P16 and P18 are coupled to ground GND. Therefore, the MOS capacitor 22 can be a PMOS transistor with a gate coupled to the ground GND and a source and drain both coupled to the supply voltage VCC. When the power lines P1, P3, P5, P7, P9, P11, P13, P15, P17 and P19 are coupled to ground GND, and power lines P2, P4, P6, P8, P10, P12, P14, P16 and P18 are coupled to the supply voltage VCC, the MOS capacitor 22 can be a NMOS transistor with a gate coupled to the supply voltage VCC and a source and drain both coupled to the ground GND.

Additionally, another MOS capacitor 30 can also be placed in the residual area RA2, and the metal lines ML1~ML3 correspond to the power lines P6~P8. Namely, the MOS capacitor 30 has a gate G connected to the power line P7 (metal line ML2), and a drain D and source S connected to the power lines P6 and P8 (the metal lines ML1 and ML3) respectively.

Similarly, the MOS capacitor 24 can be a PMOS transistor with a gate coupled to the ground GND and a source and drain both coupled to the supply voltage VCC, when the power lines P1, P3, P5, P7, P9, P11, P13, P15, P17 and P19 are coupled to supply voltage VCC, and power lines P2, P4, P6, P8, P10, P12, P14, P16 and P18 are coupled to ground GND as shown in FIG. 2B. When the power lines P1, P3, P5, P7, P9, P11, P13, P15, P17 and P19 are coupled to ground GND, and power lines P2, P4, P6, P8, P10, P12, P14, P16 and P18 are coupled to supply voltage VCC, the MOS capacitor 24 can be a NMOS transistor with a gate coupled to the supply voltage VCC and a source and drain both coupled to the ground GND.

Therefore, the MOS capacitors 22 and 24 disposed in the residual areas RA1 and RA2 serve as decoupling capacitors for minimizing noise effects.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A placement method for decoupling capacitors in an integrated circuit, comprising:
creating a floor plan of the integrated circuit, the floor plan comprising the relative locations of a plurality of functional units;
overlaying a power mesh on the floor plan, wherein the power mesh comprises a plurality power lines and divides the floor plan into a plurality of windows;
placing a plurality of semiconductor cells into a portion of the windows;
detecting whether there is a residual area comprising two adjacent windows without functional units and semiconductor cells arranged therein and having three parallel power lines of the plurality of power lines; and
placing a MOS capacitor in the detected residual area, serving as a decoupling capacitor, wherein the MOS capacitor has a gate connected to the middle of the three power lines in the detected residual area, and a drain and a source respectively connected to the remaining two power lines of three power lines in the detected residual area.

2. The placement method as claimed in claim 1, wherein the integrated circuit comprises an application specific integrated circuit (ASIC).

3. The placement method as claimed in claim 1, wherein the functional unit comprises a microprocessor.

4. The placement method as claimed in claim 1, wherein the functional unit comprises a memory.

5. The placement method as claimed in claim 1, wherein the middle power line in the detected residual area is assigned to a power voltage (VCC) and the remaining two power lines are assigned to ground.

6. The placement method as claimed in claim 5, wherein the MOS capacitor is an NMOS transistor.

7. The placement method as claimed in claim 1, wherein the semiconductor cells comprise passive devices.

8. The placement method as claimed in claim 1, wherein the semiconductor cells comprise logic cells.

9. The placement method as claimed in claim 8, wherein the logic cells comprise NOR gates, NAND gates, AND gates, OR gates and a combination thereof.

10. The placement method as claimed in claim 1, wherein the middle power line in the detected residual area is assigned to ground and the remaining two power lines are assigned to a power voltage (VCC).

11. The placement method as claimed in claim 10, wherein the MOS capacitor is a PMOS transistor.

12. The placement method as claimed in claim 10, wherein the semiconductor cells comprise active devices.

* * * * *